CASCADED TRANSISTOR AMPLIFIERS

Filed Dec. 28, 1965 2 Sheets-Sheet 1

Inventor
K. ISHIMOTO
K. TANAKA
By Walter Baum
Attorney

Sept. 30, 1969 KUNIO ISHIMOTO ET AL 3,470,485

CASCADED TRANSISTOR AMPLIFIERS

Filed Dec. 28, 1965 2 Sheets-Sheet 2

Inventor
K. ISHIMOTO-
K. TANAKA
By Walter Baum
Attorney

United States Patent Office 3,470,485

Patented Sept. 30, 1969

3,470,485
CASCADED TRANSISTOR AMPLIFIERS

Kunio Ishimoto and Kozo Tanaka, Tokyo, Japan, assignors to Nippon Electric Company, Limited, Tokyo, Japan, a corporation of Japan Filed Dec. 28, 1965, Ser. No. 516,845
Int. Cl. H03f 3/04, 3/68
U.S. Cl. 330—21 2 Claims

ABSTRACT OF THE DISCLOSURE

An improved multistage negative feedback transistorized amplifier comprising first and second stages, and an interstage circuit coupling the first and second stages and including a current transformer having a primary winding connected to the first stage collector output and a secondary winding connected to the second stage base input, the primary and secondary windings having a turns ratio of $n$:1 where $n$ is greater than 1 for increasing the current level in the secondary winding and also having leakage inductance therebetween, and a reactive impedance (capacitor) having one terminal connected to a point common to the first stage collector output and primary winding and a second terminal connected to a point common to the second stage base input and secondary winding, the reactive impedance and leakage inductance resonating at a frequency above the transmission band of said amplifier. The interstage coupling circuit may also include a resistor connected in parallel with the reactive impedance. The first and second stages may constitute corresponding stages in a three-stage negative feedback amplifier having a negative feedback connection between the first and third stages.

This invention relates to high frequency transistorized feedback amplifiers and more particularly to a multistage negative feedback amplifier of the type having a novel interstage coupling circuit.

In known high frequency transistorized negative feedback amplifiers, the transistors must have an extremely high cut-off frequency $f_T$ while the power-stage transistor must produce high-power output and consequently can not be provided with a sufficiently high cut-off frequency. It follows therefore that the penultimate-stage transistor must be provided with a considerably higher cut-off frequency for raising the amplifier overall cut-off frequency given by:

$$\frac{n\sqrt{f_n f}}{n\sqrt{f_{T1} f_{T2} \cdots f_{Tn}}},$$

where $f_{T1}$, $f_{T2}$, . . . , and $f_{Tn}$ are cut-off frequencies of the transistors of the first, the second, . . . , and the $n$th stages respectively. As a result of this required configuration, it is difficult for the penultimate stage to drive the power stage with sufficiently high power. It therefore frequently occurs even in the lower-frequency region of the transmission band of the amplifier, that the distortion of the intrinsically lower-level penultimate-stage output is so large that it cannot be neglected when compared with the distortion of the power-stage output. This distortion becomes more serious in the higher-frequency region where the considerably lowered gain of the power stage requires higher output levels for the penultimate stage than in the lower-frequency region. Thus, frequently the distortion of the penultimate stage is greaetr than that of the power stage. Moreover, in an ultrahigh-frequency amplifier, the trouble is that not only the distortion but also the over-load threshold of the penultimate stage will become dominant.

An object of this invention is therefore to provide a negative feedback amplifier having an interstage coupling circuit which not only reduces the distortion of the penultimate stage but also has improved amplification characteristics both within and above the transmission band.

The coupling circuit of this invention is arranged between the penultimate stage and the power stage of the amplifier. The coupling circuit includes: a current-boosting transformer (which has hitherto been considered difficult to use in a negative feedback amplifier because of the resulting oscillation problem) and at least one capacitor interposed between the windings of the transformer. Since the current gain is obtained by the above transformer, it is possible to reduce the distortion and raise the over-load threshold in the penultimate state. Furthermore, the above capacitor improves the gain characteristics of the amplification path not only within the transmission band but also frequencies above the transmission band.

The above-mentioned and other features and objects of this invention and the means for attaining them will become more apparent and the invention itself will be best understood by reference to the following description of embodiments of the invention taken in conjunction with the accompanying drawings in which.

Figure 1:
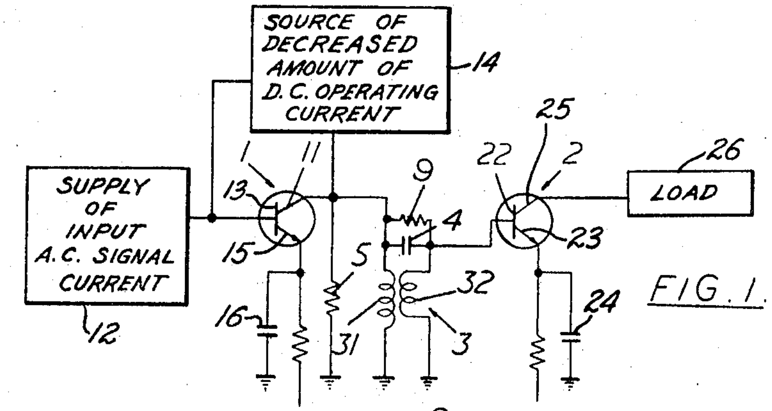
FIG. 1 is a circuit diagram of an embodiment of the invention.

In the drawing, it should be noted that the D.C. circuits are briefly shown for the sake of simplicity and to thus better stress the salient features of this invention. Penultimate stage transistor 1 comprises a supply 12 of input signal alternating current connected to a base 13, a source 14 of decreased amount of operating direct current connected to base 13 and collector 11 for a purpose that is later mentioned, and an emitter 15 alternating-current coupled via a capacitor 16 to ground. Last or power stage transistor 2 includes a base 22 connected as subsequently explained, an emitter 23 alternating-current coupled to ground via a capacitor 24, and a collector 25 connected to a load 26.

In the embodiment of FIG. 1, a transformer 3 is connected between the collector 11 of the penultimate-stage transistor 1 and the base 22 of the power-stage transistor 2. The transformer 3 is one in which $n>1$, where $n$:1 is the turn ratio of the primary and the secondary windings 31 and 32. Thus, the current flowing from the collector 11 of the penultimate-stage transistor 1 through the primary winding 31 is boosted $n$-times and flows through the secondary winding 32 to the base 22 of the power-stage transistor 2. This utilization of a transformer in the interstage coupling circuit makes it possible to augment the current and accordingly to reduce (if constant output current is required for the power-stage transistor 2) the penultimate-stage output current of the transistor 1. Inasmuch as the D.C. operating current is small for the penultimate-stage transistor 1, use of the transformer and consequent reduction of the amplitude of the A.C. signal current permit the distortion of the penultimate-stage to be reduced and the over-load threshold thereof to be raised. In this connection, it should be noted that inasmuch as only a small output current is required for the penultimate-stage transistor which drives the power-stage transistor because of the utilization of the above transformer, it is easy to select the D.C. operating point of the penultimate-stage transistor with sufficient allowance for the required driving current across the primary winding 31. Therefore, even if the input to (or the output of) the penultimate-stage transistor is increased, no problems are created thereby.

Notwithstanding the above indicated technical advantages, use of a transformer in the amplification path of a high-frequency negative feedback amplifier has generally been considered difficult because the resulting increase of the ultrahigh-frequency asymptotic loss of the $\mu\beta$ characteristics (or the feedback loop gain characteristics) and the consequent over-shift in phase are liable to introduce oscillation of the negative feedback amplifier. However, according to this invention, this difficulty is overcome by providing at least one suitable capacitor 4 between the same-polarity higher-voltage terminals of the primary and the secondary windings 31 and 32 of the transformer 3. This not only reduces the ultrahigh-frequency asymptotic loss but also improves, in cooperation with (1) the output impedance of the penultimate stage (2) the input impedance of the power stage, and (3) the leakage inductance of the transformer, the gain characteristics of the amplification path both at the higher-frequency end and at frequencies above the transmission band.

Figure 2:
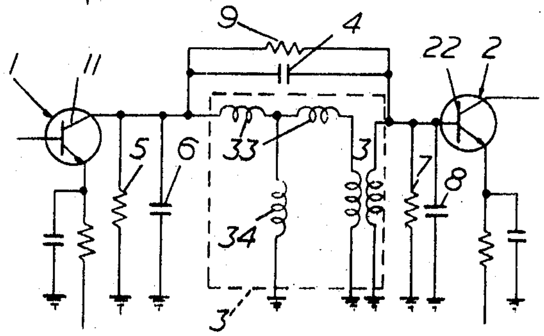
FIG. 2 shows an equivalent circuit and will be used to explain the operation of FIG. 1.
Figure 5:
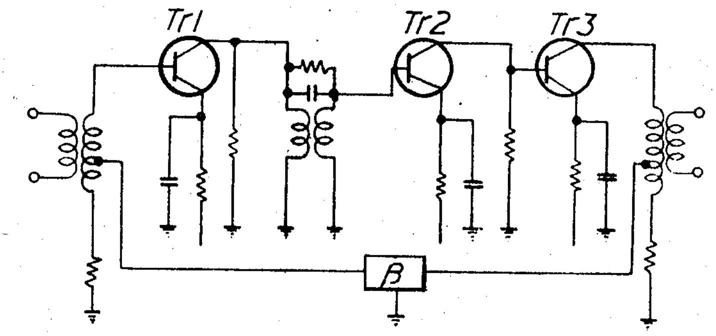
FIG. 5 is a circuit diagram of the embodiment of the invention of FIG. 1 as utilized in a multistage negative feedback amplifier.

Referring to FIG. 2 the equivalent circuit for transformer 3 of FIG. 1 is illustrated in order to detail the operation of the embodiment of FIG. 1. In FIG. 2, the resistor 5 and a capacitor 6 represent the output resistance and the output capacitance between the collector of the penultimate stage transistor 1 and ground, and the actual resistor and capacitor inclusive (if they are used on the output side). Another resistor 7 and another capacitor 8 similarly represent the input resistance and the input capacitance which are present between the base of the power-stage transistor 2 and ground. The leakage inductance 33 of the transformer 3 is connected in series, through an ideal transformer 3', between the collector 11 of transistor 1 and the base 22 of transistor 2. The capacitor 4 and a resistor 9, if used, are also connected between the collector 11 of the transistor 1 and the base 22 of the transistor 2. In this circuit, if the parallel resonance frequency of the leakage inductance 33 and the capacitor 4 is made higher than the upper end of the transmission band of the amplifier, it is easy to cause the impedance which is present in the parallel resonance circuit around the end of the transmission band, to be in series resonance (through the ideal transformer 3') with the capacitors 6 and 8 at a frequency which is slightly lower than the above-mentioned parallel resonance frequency and a little higher than the upper frequency end of the transmission band. This is the so-called series peaking. In a further case where the capacitor 4 is so selected as to be tuned, together with the leakage inductance 33, for a desired frequency at a frequency beyond the transmission band, it is possible to reduce the gain in the amplification path at frequencies above the transmission band and to shape the $\mu\beta$ characteristics of the negative feedback amplifier in FIG. 5 into a preferred form. Under certain circumstances, the resistor 9 may be used to modify the shape of the $\mu\beta$ characteristics. Incidentally, it is feasible to keep the loss negligible within the transmission band, by selecting a relatively large main inductance 34 for the transformer 3 as compared with the resistances of the output resistor 5 of the penultimate-stage transistor 1 and the input resistor 7 of the power-stage transistor 2.

Figure 3:
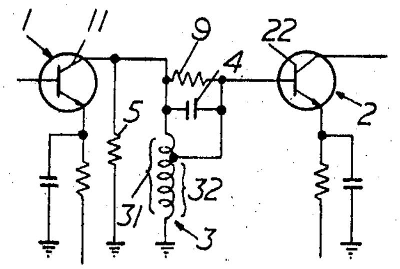
FIGS. 3 and 4 are circuit diagrams of other embodiments of the invention.
Figure 4:
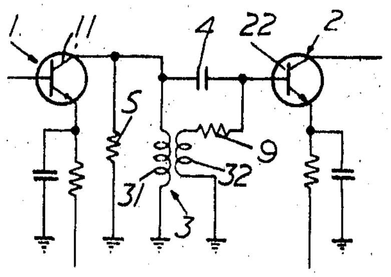

Referring to FIGS. 3 and 4, some other embodiments of this invention will now be explained. More particularly referring to FIG. 3, an autotransformer 3 is used as the coupling transformer. The operation is quite similar to the case where use is made of a two-winding transformer. In FIG. 4, the damping resistor 9 is connected in series with the transformer 3. Although a two-winding transformer is illustrated, this sort of circuitry is possible even with an autotransformer.

As has clearly been explained in the above description, it is possible in the negative feedback amplifier of this invention to reduce the distortion of the penultimate-stage and raise the over-load threshold thereof with the characteristics of the amplification path being kept in a quite desirable state both within the transmission band and beyond the transmission band, thereby enabling the power-stage and the penultimate-stage transistors to manifest their respective maximum capabilities.

For example, it is possible in a more-than-two-stage negative feedback amplifier to select an optimum D.C. operating point for the first-stage transistor in consideration of the noise figure.

Although it has been pointed out hereinabove that in a high-frequency transistorized negative feedback amplifier the distortion of the penultimate-stage output frequently becomes serious, it is becoming recognized by experts in the art that even the distortion of the first-stage output is very often serious in a three-stage or a similar amplifier of that type. The conventional remedy for the first-stage distortion is to augment the D.C. voltage or current of the first-stage transistor. This, however, adversely affects the noise figure of the first stage, because the optimum noise figure of a transistor circuit is obtainable generally with the D.C. emitter (or collector) current of about 1–2 ma. However, with this invention in which the current gain (and also the power gain) is augmented by the current-boosting transformer used in the interstage coupling circuit, it is possible to reduce the emitter (or the collector) current required for the first-stage transistor and accordingly the noise figure thereof.

Moreover, with this invention, it is possible to reduce the power consumption of the feedback amplifier. This is so because the current-boosting transformer used according to this invention reduces the power consumption required for the (preceding-stage) transistor or transistors used nearer to the input side than the transformer when compared with the large power supplied thereto to reduce the distortion (provided that such large power achieves the necessary cut-off frequency $f_T$ and noise figure). This provides remarkable technical advantages in non-attended repeaters for a carrier transmission system, since in most cases these repeaters are set into operation with the power sent thereto through the communication cable from a remote attended station.

It is also possible with this invention to augment the gain of the feedback amplifier in the absence of feedback. This is apparent from what have been described heretofore. Finally, with this invention it is easy to design and manufacture the transistors.

With this invention wherein the penultimate-stage transistor may be of the smaller-power type, it is feasible to raise the cut-off frequency and to design a higher-frequency transistor. In connection with this and with the reasons given above, it becomes possible to design a higher-power transistor for the power-stage transistor which may be provided with a relatively low cut-off frequency. It should be noted that the present invention is by no means restricted by the above-described embodiments but is practicable with various modifications according to the circumstances and that the invention displays its remarkable features and merits particularly in the ultrahigh frequency band.

While we have described above the principles of our invention in connection with specific embodiments, it is to be clearly understood that this description is made only by way of example, and not as a limitation to the scope of our invention as set forth in the objects thereof and in the accompanying claims.

What is claimed is:

1. A multistage transistorized amplifier, comprising:

a supply of input signal alternating current;

a first signal amplifying stage comprising a first transistor having a base connected to said signal supply, an emitter coupled to ground, and a collector providing all output for amplified signal current;

a source of a decreased amount of direct current connected to said base and collector for supplying said decreased amount of direct current to said base and collector to operate said transistor to decrease the level of amplified signal current in said collector output to decrease signal distortion therein;

a last signal amplifying stage comprising a second transistor having a base for receiving amplified signal current, an emitter coupled to ground, and a collector providing an output for amplified signal current;

a load connected to said last stage second transistor collector;

and an interstage circuit for coupling said first transistor collector to said second transistor base, comprising:

a current transformer including a primary winding and a secondary winding; said primary winding having one terminal connected to said first transistor collector and a second terminal connected to ground; said secondary winding having one terminal connected to said secod transistor base and a second terminal connected to ground; said primary and secondary windings having a turns ratio of $n$:1 where $n$ is greater than 1 for increasing the level of the amplified signal current in said secondary winding above the decreased level of the amplified signal current in said first transistor collector output in relation to the $n$-turns of said secondary winding to compensate for the decreased level of the amplified signal current in said last-mentioned collector output.

2. The amplifier according to claim 1 and having a predetermined signal frequency transmission band; in which said transformer includes leakage inductance; and which includes capacitance circuit means having one terminal connected to a first point common to said first transistor collector and primary winding and a second terminal connected to a second point common to said second transistor base and secondary winding; said leakage inductance and capacitance means forming a circuit resonant above said transmission band and producing a voltage of adequate magnitude as applied to said second transistor base to reduce the amplification of the signal current having frequencies above said transmission band to further decrease signal distortion in the decreased level of the amplified signal current in said first-mentioned collector output.

References Cited

UNITED STATES PATENTS

| | | | |
|---|---|---|---|
| 2,483,315 | 9/1949 | De Groot | 330—166 X |
| 2,912,656 | 11/1959 | Waring | 330—166 X |
| 3,061,792 | 10/1962 | Ebbinge | 330—21 |

FOREIGN PATENTS

| | | |
|---|---|---|
| 403,331 | 12/1931 | Australia. |

NATHAN KAUFMAN, Primary Examiner

U.S. Cl. X.R.

330—165